(12) United States Patent
Kasahara et al.

(10) Patent No.: US 6,875,630 B2
(45) Date of Patent: Apr. 5, 2005

(54) LEAD FRAME, METHOD OF MANUFACTURING THE SAME, AND METHOD OF MANUFACTURING A SEMICONDUCTOR DEVICE USING THE SAME

(75) Inventors: Tetsuichiro Kasahara, Nagano (JP); Hideto Tanaka, Suzaka (JP)

(73) Assignee: Shinko Electric Industries Co., Ltd., Nagano (JP)

(*) Notice: Subject to any disclaimer, the term of this patent is extended or adjusted under 35 U.S.C. 154(b) by 238 days.

(21) Appl. No.: 10/279,032

(22) Filed: Oct. 24, 2002

(65) Prior Publication Data
US 2003/0082854 A1 May 1, 2003

(30) Foreign Application Priority Data
Oct. 26, 2001 (JP) ........................... 2001-328528

(51) Int. Cl.[7] .................... H01L 21/44; H01L 21/48; H01L 21/50
(52) U.S. Cl. ................ 438/106; 438/112; 438/113; 438/123; 438/124
(58) Field of Search ................. 438/106, 112

(56) References Cited

U.S. PATENT DOCUMENTS

| | | | | |
|---|---|---|---|---|
| 5,422,163 A | * | 6/1995 | Kamiyama et al. | ........ 428/156 |
| 5,474,958 A | * | 12/1995 | Djennas et al. | ........ 29/827 |
| 6,515,356 B1 | * | 2/2003 | Shin et al. | ........ 257/678 |
| 6,630,374 B2 | * | 10/2003 | Yamamoto | ........ 438/124 |
| 6,709,892 B2 | * | 3/2004 | Kobayakawa et al. | ........ 438/111 |
| 2004/0106235 A1 | * | 6/2004 | Igarashi et al. | ........ 438/127 |

FOREIGN PATENT DOCUMENTS

JP  10-12773  1/1998

* cited by examiner

*Primary Examiner*—John F. Niebling
*Assistant Examiner*—Angel Roman
(74) *Attorney, Agent, or Firm*—Armstrong, Kratz, Quintos, Hanson & Brooks, LLP

(57) ABSTRACT

In a method of manufacturing a lead frame for use in a leadless package such as a quad flat non-leaded package (QFN), a base frame is first formed which includes a region for resin-molding a plurality of semiconductor elements to be mounted on one surface of the base frame, the region being partitioned into land shapes, and in which a die-pad portion and lead portions around the die-pad portion are defined severally for the individual semiconductor elements to be mounted in each of the partitioned regions for resin-molding. Next, an adhesive tape is attached to the other surface of the base frame, and subsequently a cut portion is provided at a portion corresponding to a region between two adjacent partitioned regions for resin-molding, of the adhesive tape.

5 Claims, 9 Drawing Sheets

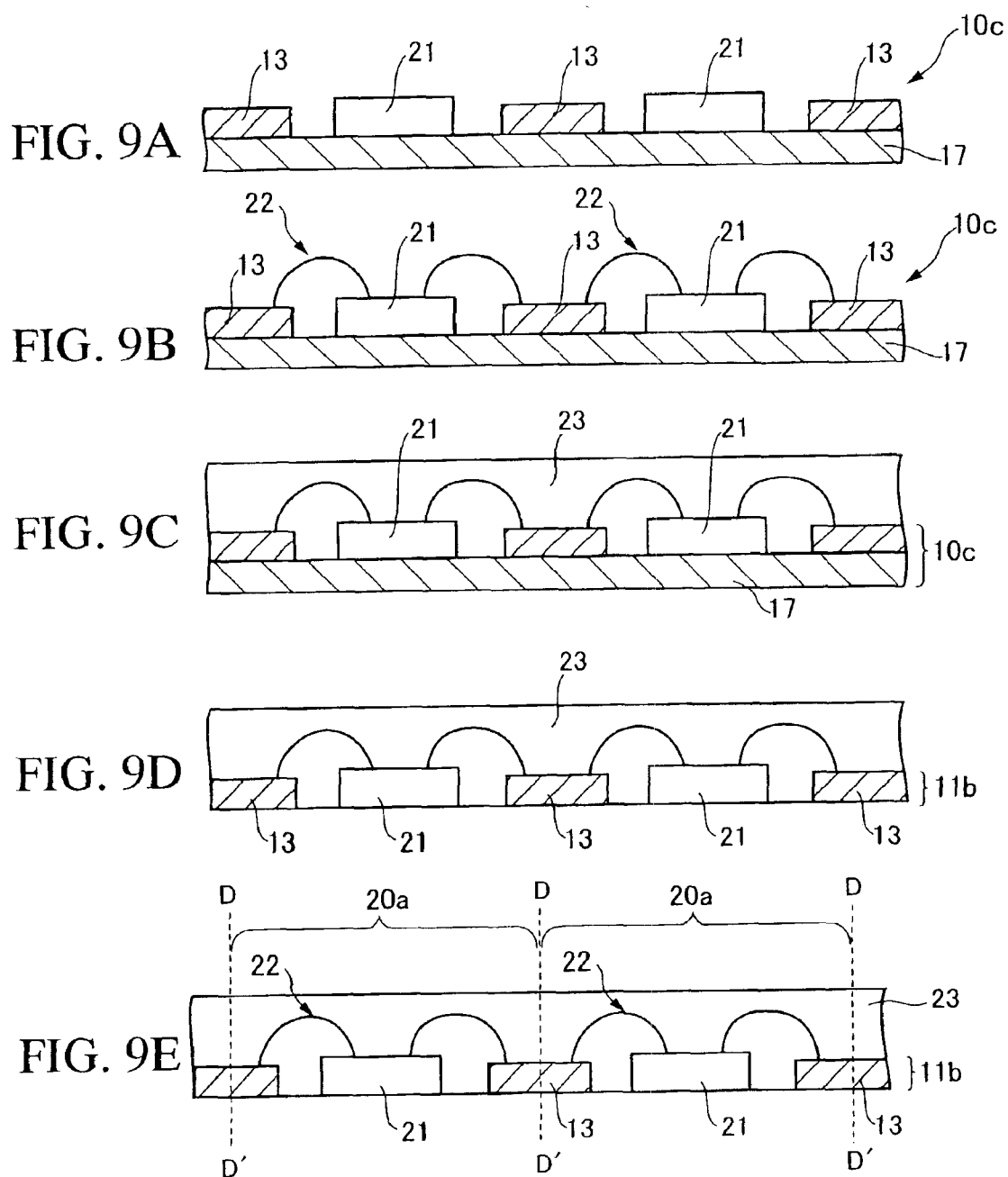

LEAD FRAME, METHOD OF MANUFACTURING THE SAME, AND METHOD OF MANUFACTURING A SEMICONDUCTOR DEVICE USING THE SAME

BACKGROUND OF THE INVENTION (a) Field of the Invention

The present invention relates to a lead frame used as a substrate of packages for mounting semiconductor elements. More specifically, it relates to a lead frame for use in a leadless package such as a quad flat nonleaded package (QFN), a small outline non-leaded package (SON), or the like, which is molded with resin by a mass molding in an assembly process of the packages, also to a method of manufacturing the lead frame and to a method of manufacturing a semiconductor device using the lead frame.

(b) Description of the Related Art

When a leadless package such as a QFN is fabricated, a basic process thereof includes the steps of mounting semiconductor elements severally on die-pad portions of a lead frame (die bonding), electrically connecting electrodes of the semiconductor elements to lead portions of the lead frame with bonding wires (wire bonding), molding the semiconductor elements, the bonding wires and the like with molding resin (molding), dividing the lead frame into individual semiconductor devices (dicing), and the like.

Also, as the type of molding, there are an individual molding method in which the semiconductor elements are individually molded with resin, and a mass molding method in which a plurality of semiconductor elements are severally molded together with resin. However, since a resin molding is individually performed for each of the semiconductor elements in the individual molding method, there is a difficulty in terms of an efficient package assembly as compared to the mass molding method. Accordingly, the mass molding method has been a mainstream in recent trends.

In the prior art, it is a common practice to perform such a mass molding in the state in which an adhesive tape is attached to an entire back surface of the frame, so as to prevent a leakage of molding resin (which is also referred to as "mold flush") from the back surface of the frame. Namely, an attaching of the adhesive tape to one of the surfaces of the lead frame (taping) has generally been performed prior to the package assembly process.

Use of the mass molding method is advantageous in terms of an efficient package assembly. However, since the adhesive tape is attached to one of the surfaces of the lead frame as mentioned above, a problem occurs in the event of a heat treatment in the molding step in that the lead frame is warped due to a difference in the coefficient of thermal expansion between a material (metal) constituting the lead frame and a material (organic resin or the like) constituting the adhesive tape. Presence of such a warp inhibits a stable package assembly and thereby causes a lowering in reliability as semiconductor devices.

In view of this, as an approach to deal with the disadvantage, a method of attaching adhesive tapes which are sectioned for respective regions on a lead frame required upon resin molding has been adapted instead of attaching an adhesive tape entirely on one of the surfaces of the lead frame. By sectioning the adhesive tape into tiny pieces and attaching them, it is possible to reduce a shrinkage of the individually sectioned tapes and to thereby reduce a warp of the entire lead frame.

However, it is necessary to increase the frequency of the taping step in accordance with the number of the sectioned adhesive tapes, which has been sufficient just by once (namely, the load on the taping step is increased). As a result, there has been a problem of a lowering in efficiency in the process of manufacturing a lead frame.

SUMMARY OF THE INVENTION

An object of the present invention is to provide a lead frame capable of effectuating partial taping without increasing the load on the taping step and thereby capable of reducing a warp of the frame, also to provide a method of manufacturing the lead frame and a method of manufacturing a semiconductor device using the lead frame.

To attain the above object, according to one aspect of the present invention, there is provided a method of manufacturing a lead frame, which includes a step of forming a base frame which includes a region for resin-molding a plurality of semiconductor elements to be mounted on one surface of the base frame, the region being partitioned into land shapes, and in which a die-pad portion and lead portions around the die-pad portion are defined severally for the individual semiconductor elements to be mounted in each of the partitioned regions for resin-molding; a step of attaching an adhesive tape to another surface of the base frame; and a step of providing the adhesive tape with a cut portion at a portion corresponding to a region between two adjacent partitioned regions for resin-molding.

According to the method of manufacturing a lead frame of this aspect, the adhesive tape is attached to one surface of the base frame in a single step and then the cut portion is provided at the portion corresponding to the region between the adjacent regions for resin-molding. Therefore, since such taping is sufficient just by once, it is possible to solve the problem of an increase in the load on the taping step as in the prior art. Also, provision of the cut portion at the given portion of the adhesive tape can realize a state equivalent to a state of individually taping (partially taping) the regions for resin-molding, and thereby it is possible to reduce a warp of the frame.

Also, according to a modified aspect of the method of manufacturing a lead frame of the foregoing aspect, there is provided a method of manufacturing a lead frame, which includes a step of forming a base frame which includes a region for resin-molding a plurality of semiconductor elements to be mounted on one surface of the base frame, the region being partitioned into land shapes, and in which an opening portion and lead portions around the opening portion are defined severally for the individual semiconductor elements to be mounted in each of the partitioned regions for resin-molding; a step of attaching an adhesive tape to another surface of the base frame; and a step of providing the adhesive tape with a cut portion at a portion corresponding to a region between two adjacent partitioned regions for resin-molding.

Also, according to another aspect of the present invention, there is provided a lead frame manufactured by any one of the above-described methods of manufacturing a lead frame.

Also, according to still another aspect of the present invention, there are provided methods of manufacturing a semiconductor device using the lead frame of the foregoing aspect. One of the methods of manufacturing the semiconductor device includes the steps of mounting semiconductor elements severally on the respective die-pad portions of the lead frame, electrically connecting electrodes of each of the semiconductor elements to lead portions corresponding to the electrodes, of the lead frame, severally with bonding wires, molding the die-pad portions, the semiconductor elements, the bonding wires and the lead portions of the lead frame with molding resin, peeling off the adhesive tape, and dividing the lead frame on which the semiconductor elements are mounted, into individual semiconductor devices such that each of the semiconductor devices contains a corresponding one of the semiconductor elements.

Also, another method of manufacturing a semiconductor device includes the steps of mounting semiconductor elements severally on the adhesive tapes in respective opening portions of the lead frame, electrically connecting electrodes of each of the semiconductor elements to lead portions corresponding to the electrodes, of the lead frame, severally with bonding wires, molding the semiconductor elements, the bonding wires and the lead portions of the lead frame with molding resin, peeling off the adhesive tape, and dividing the lead frame on which the semiconductor elements are mounted, into individual semiconductor devices such that each of the semiconductor devices contains a corresponding one of the semiconductor elements.

BRIEF DESCRIPTION OF THE DRAWINGS

FIG. 9A to FIG. 9E are cross-sectional views showing a process of manufacturing the semiconductor device shown in FIG. 8.

DESCRIPTION OF THE PREFERRED EMBODIMENTS

Figure 1A:
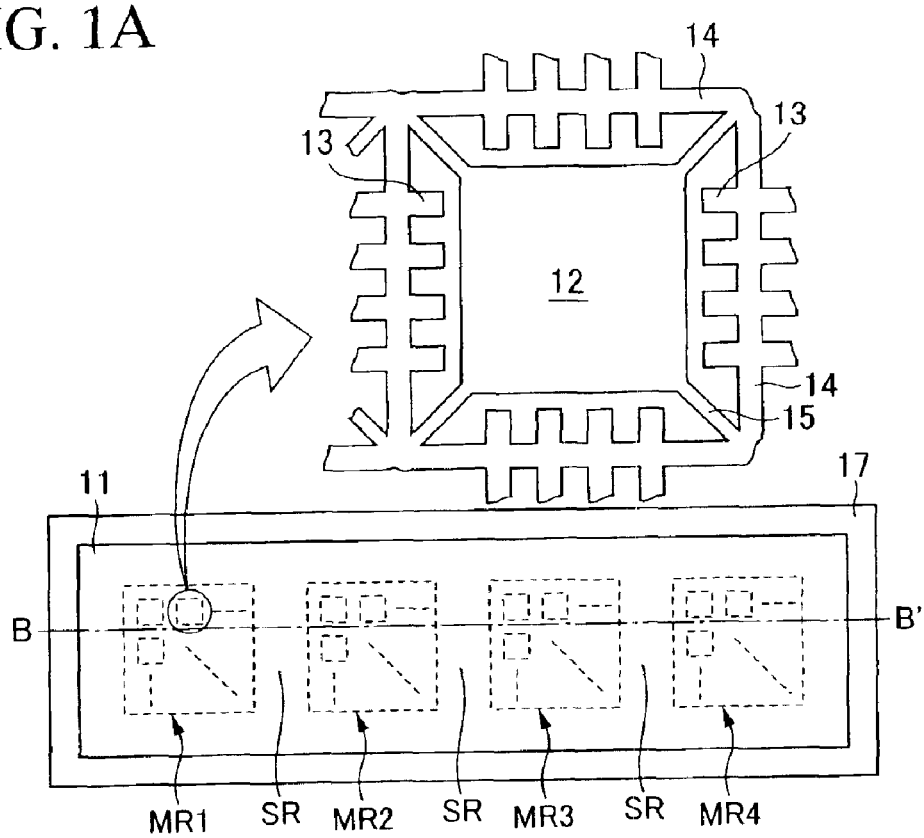
FIG. 1A to FIG. 1C are views showing a constitution of a lead frame according to a first embodiment of the present invention.
Figure 1B:
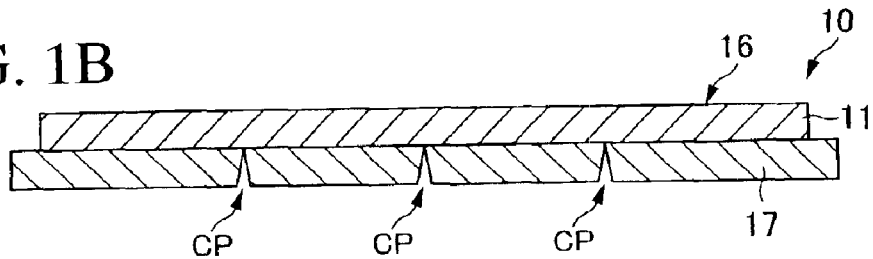
Figure 1C:
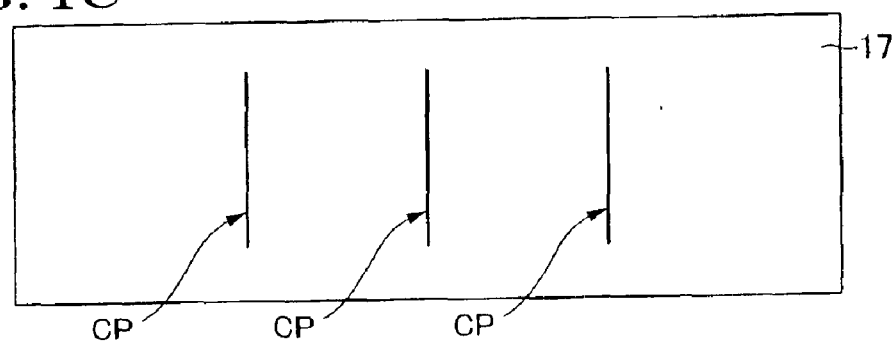

FIG. 1A to FIG. 1C schematically show a constitution of a lead frame according to a first embodiment of the present invention. In the drawings, FIG. 1A shows a plan-view constitution of the lead frame viewed from one surface thereof (the side on which regions for resin-molding semiconductor elements to be mounted are defined), FIG. 1B shows a cross-sectional structure of the lead frame viewed along B–B' line in FIG. 1A, and FIG. 1C shows a plan-view structure of the lead frame viewed from the other surface thereof (the opposite side to the side on which the resin-molding regions are defined), respectively.

A lead frame 10 according to this embodiment is basically composed of a base frame 11 to be used as a substrate of a QFN. As shown in FIG. 1A, a plurality of resin-molding regions MRi (i=1 to 4) are defined separately in land shapes on one surface of the base frame 11. A plurality of semiconductor elements are mounted on each of the resin-molding regions MRi as described later, which are resin-molded by a mass molding method. Therefore, as shown in an upper part of FIG. 1A, the base frame 11 is formed in such a manner that a die-pad portion 12 and lead portions 13 around the die-pad portion 12 are defined severally for each of the semiconductor elements to be mounted within the resin-molding region MRi.

Also, reference numeral 14 denotes a frame portion. The lead portions 13 extend in a comb shape from the frame portion 14 toward the die-pad portion 12. Further, the die-pad portion 12 is supported by four support bars 15 severally extending from four corners of the frame portion 14. Each of the lead portions 13 includes an inner lead portion to be electrically connected to an electrode of the semiconductor element, and an outer lead portion (an external connection terminal) to be electrically connected to a wiring on a packaging substrate. Moreover, a metal film 16 is formed on a surface of the base frame 11.

On the other hand, an adhesive tape 17 is attached to the other surface of the base frame 11. Cut portions CP, which characterizes the present invention, are provided on the adhesive tape 17 in regions SR (also referred to as "sectioning regions") between the adjacent resin-molding regions MRi. As shown in FIG. 1C, the cut portions CP are partially provided on the adhesive tape 17 so that the adhesive tape 17 is in an integrally connected state.

Hereinafter, description will be made with respect to a method of manufacturing the lead frame 10 of this embodiment with reference to FIG. 2A to FIG. 2D collectively showing the manufacturing steps thereof.

In the first step (FIG. 2A), a metal plate is patterned by either etching or stamping to form the base frame 11.

Figure 2A:
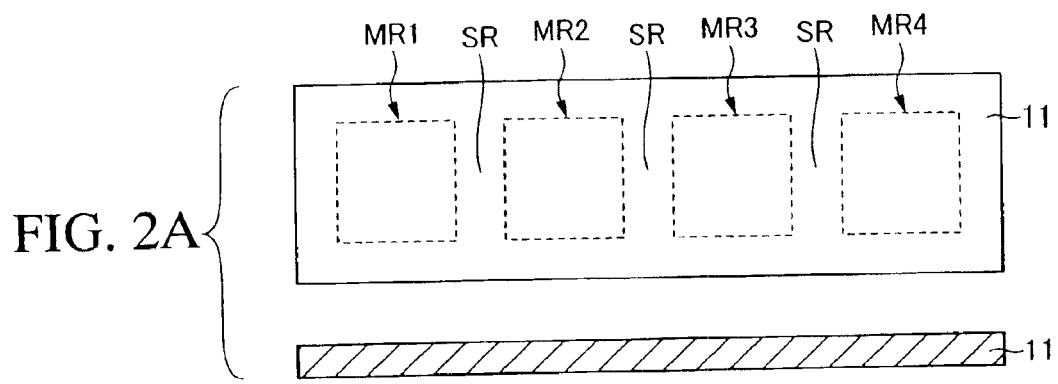
FIG. 2A to FIG. 2D are cross-sectional views (partially, plan views) showing a process of manufacturing the lead frame shown in FIG. 1A to FIG. 1C.
Figure 2B:
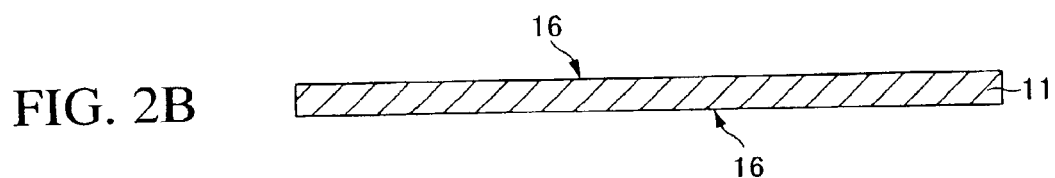
Figure 2C:
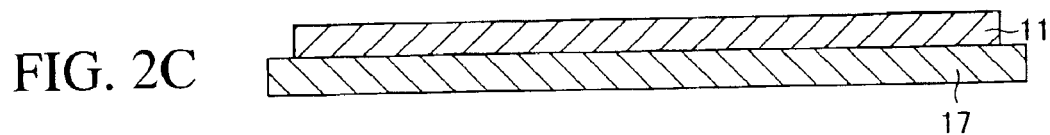
Figure 2D:
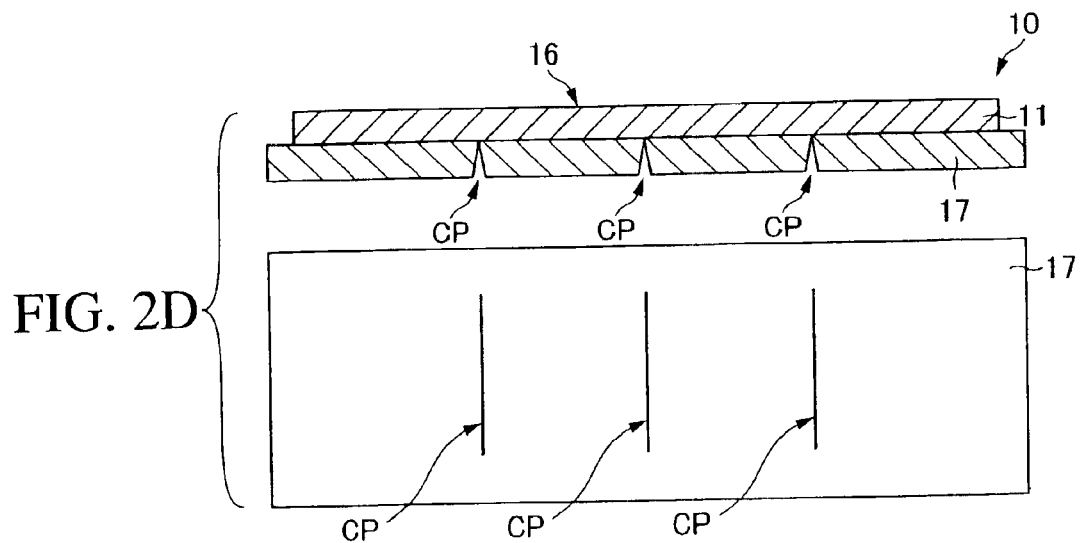

As schematically shown in an upper part of FIG. 2A, the base frame 11 to be formed has a structure in which the plurality of resin-molding regions MR1 to MR4 are defined separately in land shapes on one surface of the base frame 11. Furthermore, in each of the resin-molding regions MRi (i=1 to 4), the die-pad portion 12 and the lead portions 13 around the die-pad portion 12 are defined severally for each of the plurality of semiconductor elements to be mounted as shown in FIG. 1A.

Here, copper (Cu), a Cu-based alloy, iron-nickel (Fe—Ni), an Fe—Ni-based alloy, or the like, is used as the material of the metal plate, for example. Also, the thickness of the metal plate (the base frame 11) is selected to be about 200 $\mu$m.

In the next step (FIG. 2B), the metal film 16 is formed entirely or partially on the base frame 11 by electrolytic plating.

For example, nickel (Ni) is plated on the surface of the base frame 11 for the purpose of enhancing adhesion while using the base frame 11 as a feed layer, then palladium (Pd) is plated on the Ni layer for the purpose of enhancing conductivity, and gold (Au) is further flashed on the Pd layer so as to form the metal film (Ni/Pd/Au) 16.

In the next step (FIG. 2C), the adhesive tape 17 made of epoxy resin, polyimide resin, polyester resin, or the like, is attached to the base frame 11 on an opposite side (which is a lower surface in the illustrated example) to the side on which the resin-molding regions MRi are defined (taping).

This "taping" is basically performed as a countermeasure for preventing a leakage of molding resin (which is also referred to as "mold flush") from the back surface of the frame in the event of molding during a package assembly process to be carried out later.

In the final step (FIG. 2D), the cut portions CP are provided on the adhesive tape 17 at the portions corresponding to the sectioning regions SR between the adjacent resin-molding regions MR1 to MR4.

Here, a cutter may be used as means for providing the cut portions CP, for example. Alternatively, it is also possible to press a die (a punch), which is either provided with a sharp edge or formed into a wedge shape, onto the relevant portions.

Note that, upon providing the cut portions CP using the above-mentioned means, there may be a case that the base frame 11 is bruised depending on the pressing force. However, such bruises do not cause a serious problem because the positions where the cut portions CP are provided are the regions corresponding to the sectioning regions SR between the resin-molding regions MRi.

By the above steps, the lead frame 10 (FIG. 1A to FIG. 1C) of this embodiment is manufactured.

According to the lead frame 10 and the manufacturing method thereof of this embodiment, it is possible to complete the taping just by once, instead of dividing the tape into pieces and then attaching them in line with the respective resin-molding regions as in the prior art. Therefore, it is possible to solve the problem of an increase in the load on the taping step as in the prior art.

Also, the cut portions CP are partially provided at the portions of the adhesive tape 17 corresponding to the regions (the sectioning regions SR) between the respective resin-molding regions MRi after the adhesive tape 17 is attached in one step. Accordingly, the state equivalent to the state of separately taping for the respective resin-molding regions MRi (partial taping) is realized. As a result, it is possible to reduce a warp of the lead frame 10.

Furthermore, the cut portions CP are partially provided such that the adhesive tape 17 can maintain the integrally connected state as shown in FIG. 1C. Accordingly, when this adhesive tape 17 is peeled off after performing molding upon the package assembly at a later stage, such a "peel-off" step can be completed just by once. This contributes to a reduction in the load on the step.

Figure 3A:
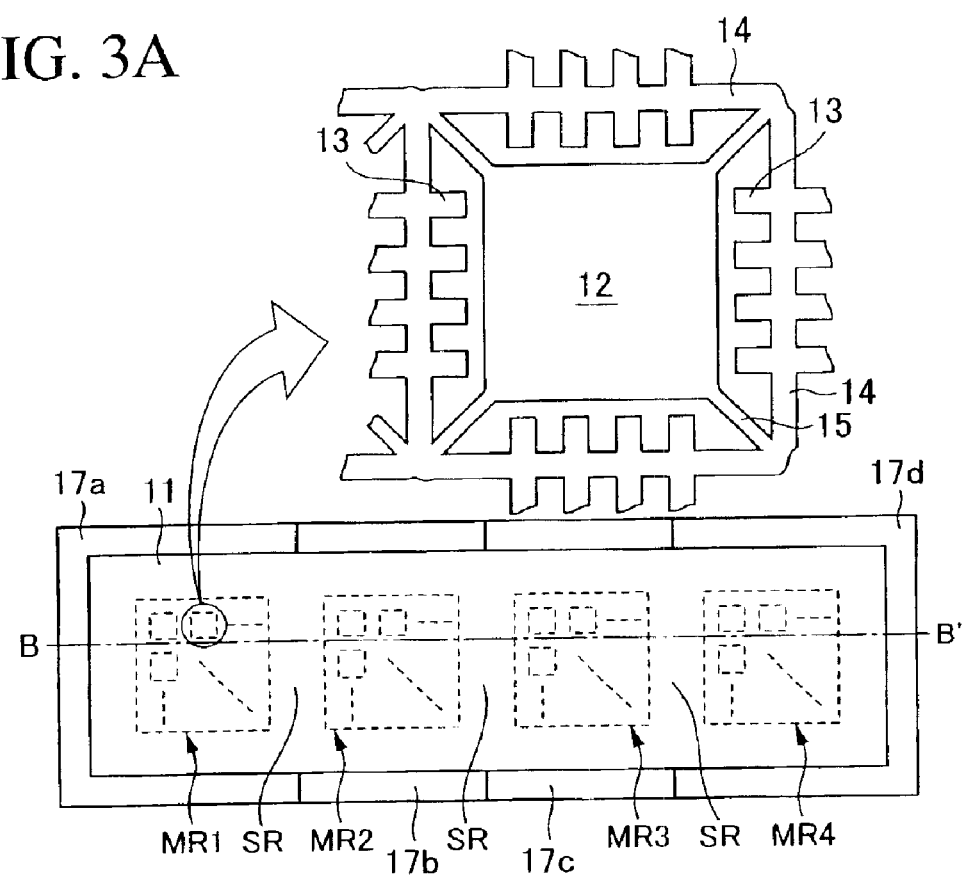
FIG. 3A to FIG. 3C are views showing a constitution of a lead frame according to a second embodiment of the present invention.
Figure 3B:
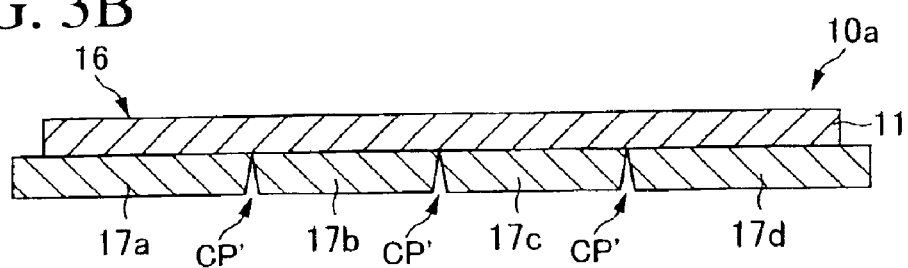
Figure 3C:
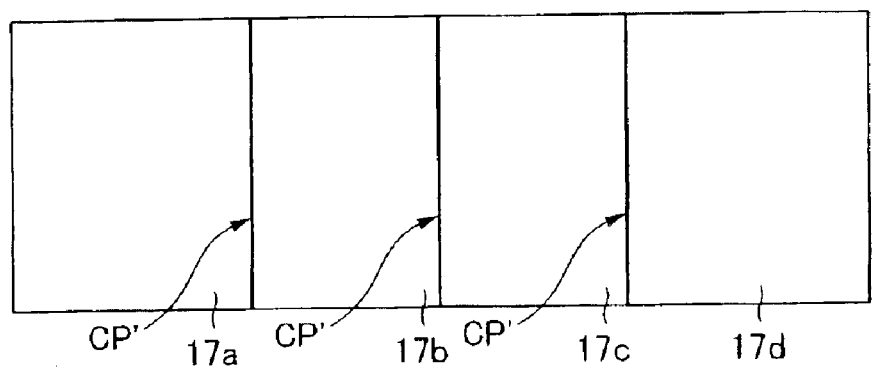

In the above-described embodiment (FIG. 1A to FIG. 2D), description has been made regarding the case in which the cut portions CP are partially provided on the adhesive tape 17 so as to maintain the integrally connected state. However, as is obvious from the gist of the present invention (to realize the state equivalent to the "partial taping" by providing the cut portions at given portions of the adhesive tape after attaching the adhesive tape in one step), it is needless to say that shapes or forms of the cut portions are not limited to the foregoing aspect. For example, it is also possible to provide the cut portions so as to completely cut the adhesive tape. An example in that case (second embodiment) is shown in FIG. 3A to FIG. 3C.

A lead frame 10a according to the second embodiment is different from the lead frame 10 shown in FIG. 1A to FIG. 1C in that cut portions CP' are provided so that adhesive tapes 17a, 17b, 17c and 17d are sectioned (completely cut away) for the resin-molding regions MR1, MR2, MR3 and MR4, respectively. Other constitution is the same as the first embodiment (FIG. 1A to FIG. 1C), and thus description thereof will be omitted. Also, a method of manufacturing the lead frame 10a is basically the same as the manufacturing steps shown in FIG. 2A to FIG. 2D, and thus description thereof will be also omitted.

Figure 4A:
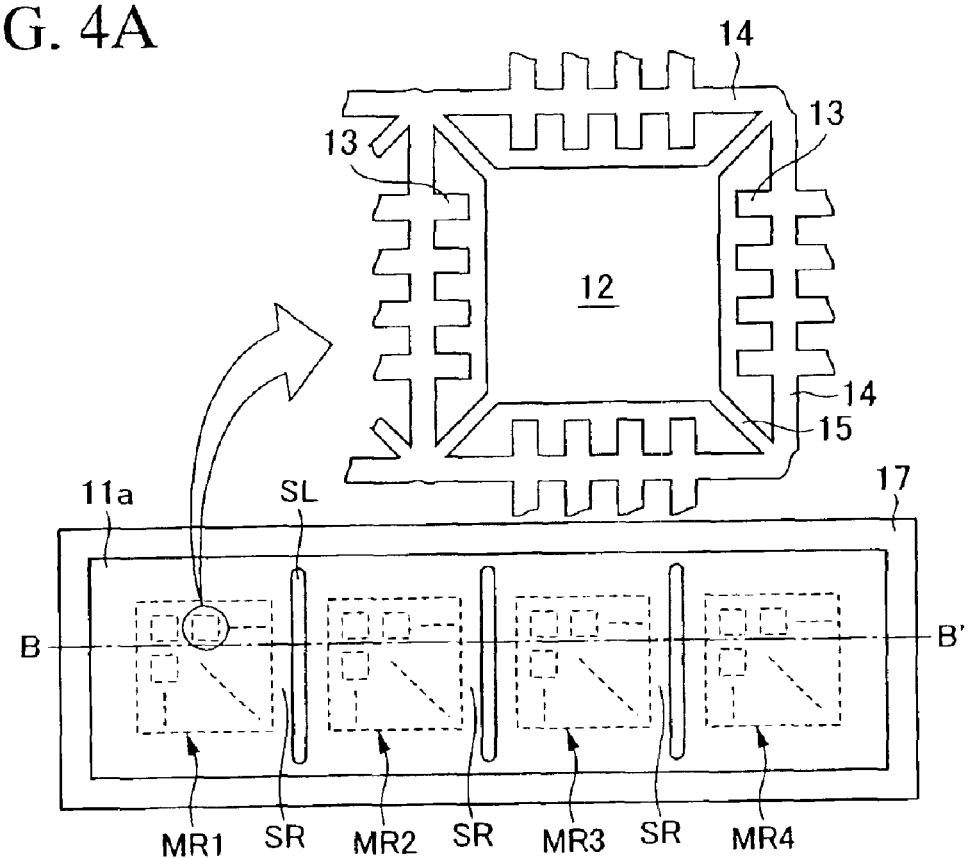
FIG. 4A to FIG. 4C are views showing a constitution of a lead frame according to a third embodiment of the present invention.
Figure 4B:
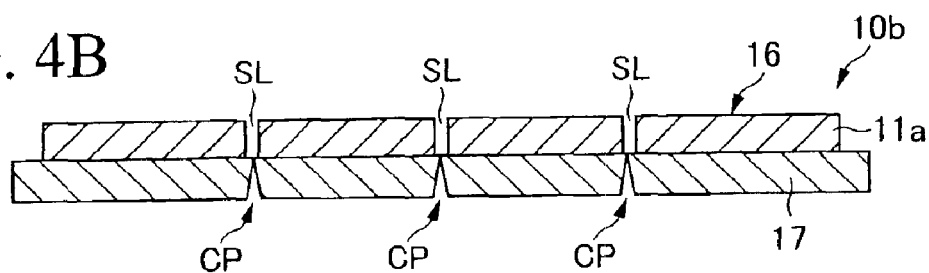
Figure 4C:
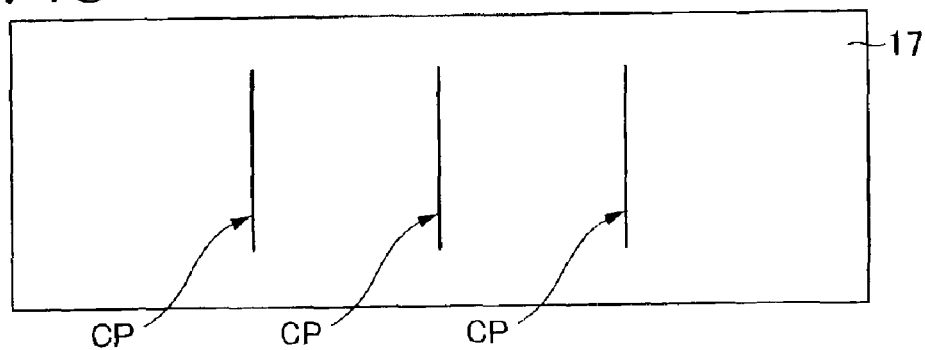

FIG. 4A to FIG. 4C schematically show a constitution of a lead frame according to a third embodiment of the present invention.

A lead frame 10b according to the third embodiment is different from the lead frame 10 shown in FIG. 1A to FIG. 1C in that slits SL are formed at portions of a base frame 11a corresponding to the portions of the adhesive tape 17 on which cut portions CP are provided. Other constitution is the same as the first embodiment (FIG. 1A to FIG. 1C), and thus description thereof will be omitted.

Hereinafter, description will be made with respect to a method of manufacturing the lead frame 10b of this embodiment with reference to FIG. 5A to FIG. 5D collectively showing the manufacturing steps thereof.

In the first step (FIG. 5A), a metal plate (a Cu plate or a Cu-based alloy plate, for example) is patterned by either etching or stamping to form the base frame 11a.

Figure 5A:
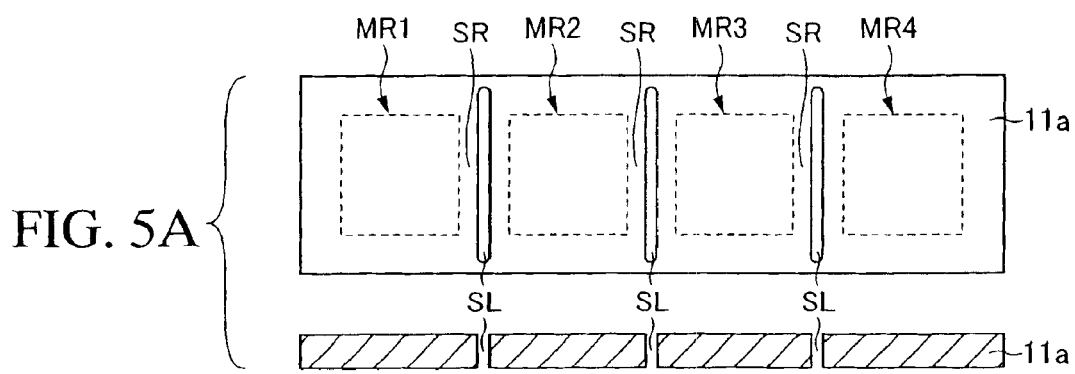
FIG. 5A to FIG. 5D are cross-sectional views (partially, plan views) showing a process of manufacturing the lead frame shown in FIG. 4A to FIG. 4C.
Figure 5B:
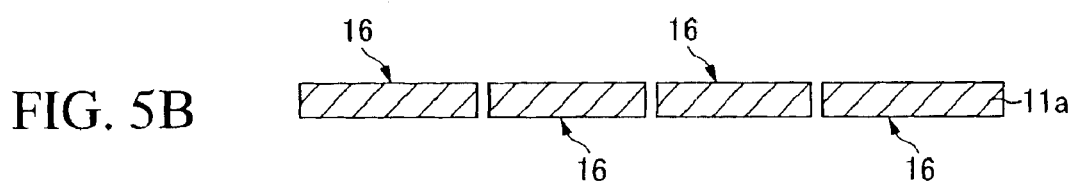
Figure 5C:
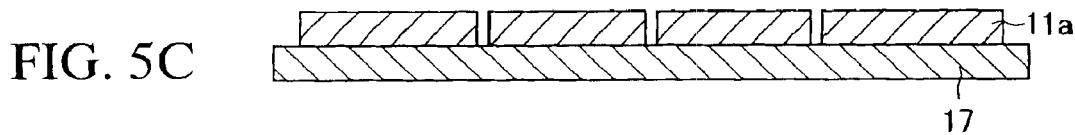
Figure 5D:
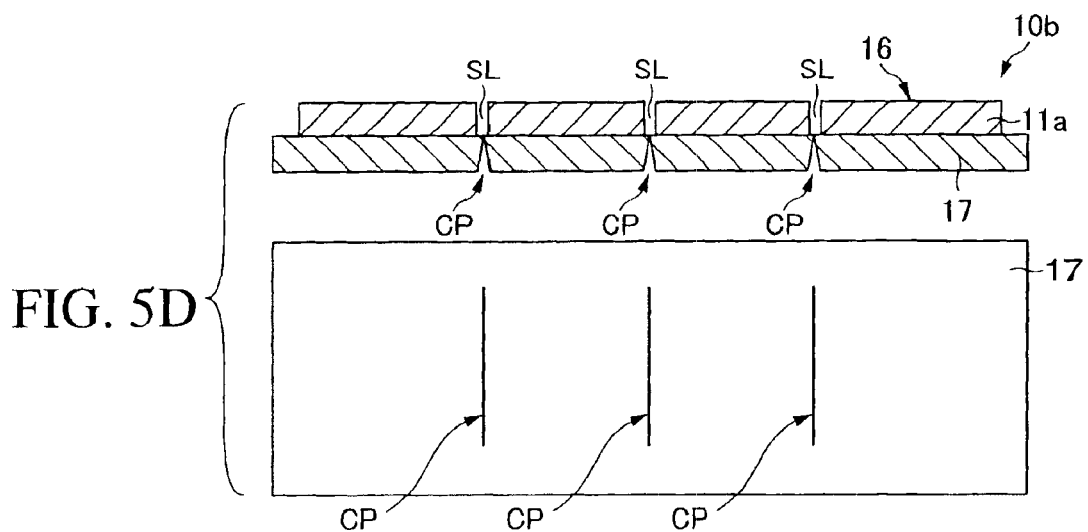

As schematically shown in an upper part of FIG. 5A, the base frame 11a to be formed has a structure in which a plurality of resin-molding regions MRi (i=1 to 4) are defined separately in land shapes on one surface thereof. Moreover, in each of the resin-molding regions MRi, the die-pad portion 12 and lead portions 13 around the die-pad portion 12 are defined severally for each semiconductor element to be mounted as shown in FIG. 1A.

In addition, in the event of patterning the metal plate by etching or stamping, the slits SL are formed on the sectioning regions SR (regions between the adjacent resin-molding regions MRi) of the base frame 11a.

In the next step (FIG. 5B), a metal film 16 (Ni/Pd/Au) is formed entirely on the base frame 11a provided with the slits SL by electrolytic plating.

In the next step (FIG. 5C), the adhesive tape 17 made of epoxy resin, polyimide resin, polyester resin, or the like, is attached to the base frame 11a on an opposite side (which is a lower surface in the illustrated example) to the side on which the resin-molding regions MRi are defined (taping).

In the final step (FIG. 5D), the cut portions CP are provided on the adhesive tape 17 at the portions corresponding to the portions of the base frame 11a at which the slits SL are formed.

By the above steps, the lead frame 10b (FIG. 4A to FIG. 4C) of this embodiment is manufactured.

According to the lead frame 10b and the manufacturing method thereof of this embodiment, the slits SL are formed at the portions of the base frame 11a corresponding to the portions of the adhesive tape 17 on which the cut portions CP are provided. Therefore, it is easier to provide the cut portions CP on the relevant portions of the adhesive tape 17 by pressing a die (a punch) with an edge formed into a wedge shape while aligning the die with the respective positions of the slits SL.

It is also possible to use a cutter instead of the die (the punch) for providing the cut portions CP. In this case, it is conceivable that provision of straight cut portions CP may be difficult using the cutter in the lead frames 10 and 10a according to the first and second embodiments (FIG. 1A to FIG. 3C) because slits are not provided on the base frame 11.

On the contrary, according to the third embodiment (FIG. 4A to FIG. 5D), it is possible to easily provide the straight cut portions CP at the relevant positions of the adhesive tape 17 by presence of the slits SL, by operating the cutter in line with the respective positions of the slits SL.

In other words, the third embodiment has an advantage to facilitate provision of the cut portions on the adhesive tape 17 as compared to the first and second embodiments (FIG. 1A to FIG. 3C).

Figure 6:
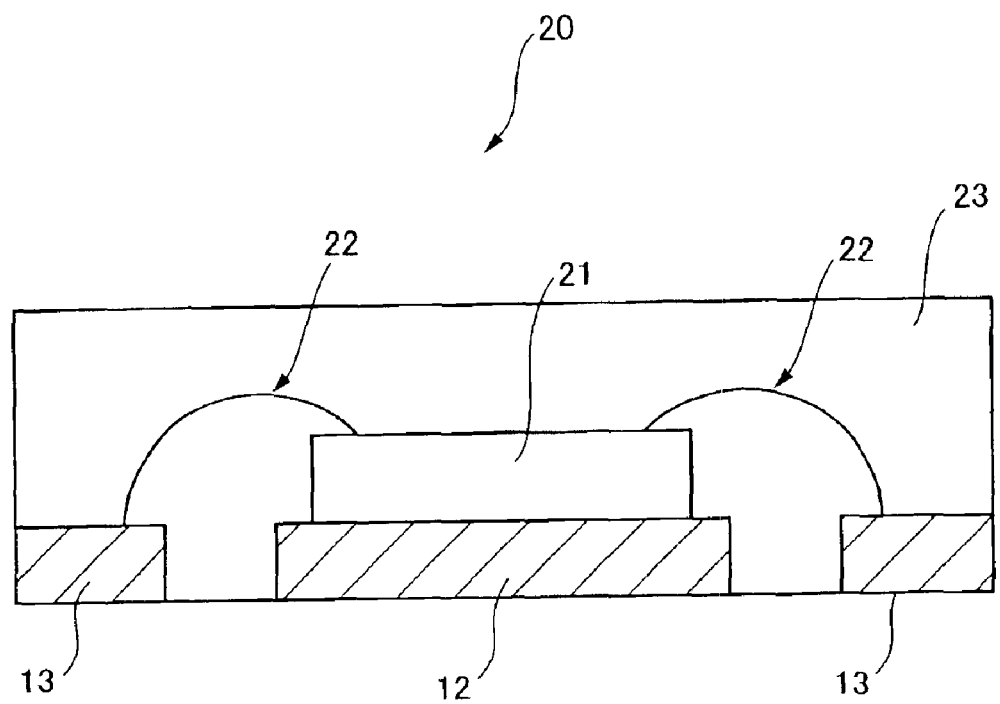
FIG. 6 is a cross-sectional view showing a constitution of a semiconductor device manufactured using the lead frame shown in FIG. 1A to FIG. 1C.
Figure 7:
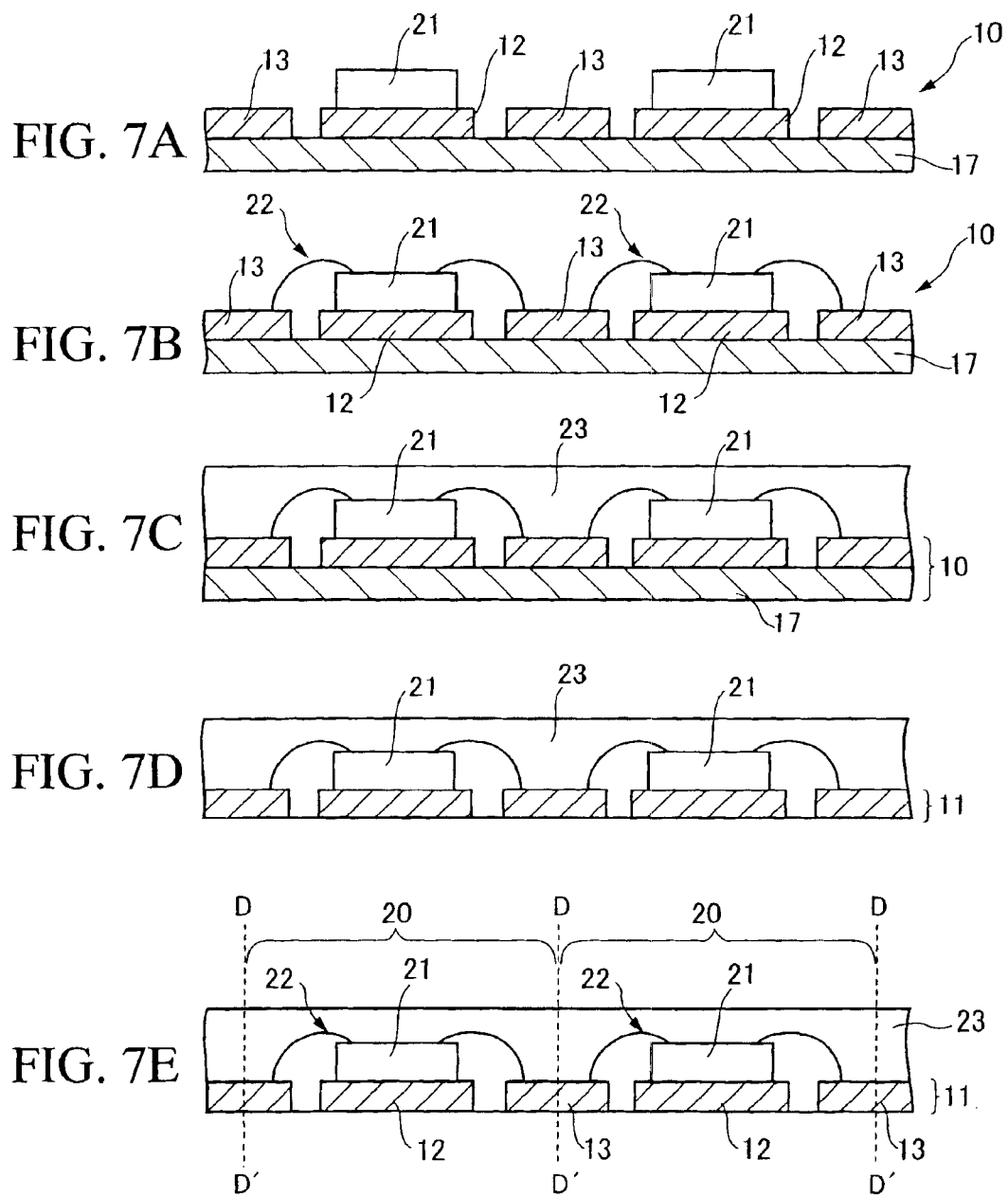
FIG. 7A to FIG. 7E are cross-sectional views showing a process of manufacturing the semiconductor device shown in FIG. 6.

FIG. 6 shows an example of a semiconductor device having a QFN package structure manufactured using the lead frame 10 (FIG. 1A to FIG. 2D) according to the first embodiment.

In FIG. 6, reference numeral 20 denotes a semiconductor device; reference numeral 21 denotes a semiconductor element mounted on the die-pad portion 12; reference numeral 22 denotes a bonding wire for electrically connecting an electrode of the semiconductor element 21 to the lead portion 13; and reference numeral 23 denotes molding resin for protecting the semiconductor element 21, the bonding wire 22 and the like.

Hereinafter, description will be made with respect to a method of manufacturing the semiconductor device 20 with reference to FIG. 7A to FIG. 7E collectively showing the manufacturing steps thereof.

In the first step (FIG. 7A), the lead frame 10 is held with a holding jig (not shown) while allowing the surface attaching the adhesive tape 17 to be placed downward, and then the semiconductor elements 21 are severally mounted on the respective die-pad portions 12 of the lead frame 10. To be more precise, an adhesive agent such as epoxy resin is coated on the die-pad portions 12, whereby the semiconductor elements 21 are adhered to the die-pad portions 12 with the adhesive agent while putting back surfaces (opposite surfaces to the surfaces on which the electrodes are formed) of the semiconductor elements 21 downward.

In the next step (FIG. 7B), the electrodes of the respective semiconductor elements 21 and the corresponding lead portions 13 on one surface of the lead frame 10 (which is the upper side in the illustrated example) are electrically connected with the bonding wires 22 severally. In this way, the semiconductor elements 21 are mounted on the lead frame 10.

At this stage, as is understood from the plan-view constitution shown in FIG. 1A, each lead portion 13 is possessed in common by two adjacent die-pad portions 12.

In the next step (FIG. 7C), an entire surface of the lead frame 10 on the side where the semiconductor elements 21 are mounted is molded with the molding resin 23 by a mass molding method. Although it is not particularly illustrated in the drawing, such molding is performed by disposing the lead frame 10 on a lower die of molding dies (a pair of upper and lower dies) and binding the lead frame 10 with the upper die from above, and then by performing a heating and pressurizing treatment while filling the molding resin 23. Transfer molding, for example, is used as a mode of molding.

In the next step (FIG. 7D), the lead frame 10 (FIG. 7C) molded with the molding resin 23 is taken out of the molding dies, and then the adhesive tape 17 is peeled off and removed from the base frame 11.

In this event, where the adhesive tape 17 attached to the base frame 11 has the form as shown in FIG. 1C (i.e., the form where the cut portions CP are partially provided), the step of peeling off the adhesive tape 17 requires only one operation because the adhesive tape 17 is integrally connected. Namely, it is possible to simplify the peeling operation.

In the final step (FIG. 7E), the base frame 11 (the lead frame mounting the respective semiconductor elements 21 thereon) is divided into package units along dividing lines D–D' as illustrated with broken lines using a dicer or the like, such that each package unit includes one semiconductor element 21 to obtain the semiconductor device 20 (FIG. 6). Here, the dividing lines D–D' are aligned with lines passing through the center of the frame portion 14 illustrated in FIG. 1A.

In the foregoing method of manufacturing the semiconductor device 20, description has been made by way of the example of using the lead frame 10 according to the first embodiment (FIG. 1A to FIG. 2D). However, the manufacturing method is also applicable similarly to the case of using the lead frame 10a according to the second embodiment (FIG. 3A to FIG. 3C) or the lead frame 10b according to the third embodiment (FIG. 4A to FIG. 5D).

Also, in the respective embodiments described above, description has been made regarding the case where the respective base frames 11 and 11a constituting the lead frames have the shapes including the die-pad portions 12 (FIG. 1A, FIG. 3A and FIG. 4A) for mounting the semiconductor elements. However, as is obvious from the gist of the present invention (which is to provide the cut portions at the portions of the adhesive tape corresponding to the regions between the adjacent resin-molding regions after attaching the adhesive tape entirely onto one of the surfaces of the base frame in one step), the present invention is also applicable similarly to the case where a lead frame does not include die-pad portions. FIG. 8 and FIG. 9A to FIG. 9E collectively show one example in that case.

Figure 8:
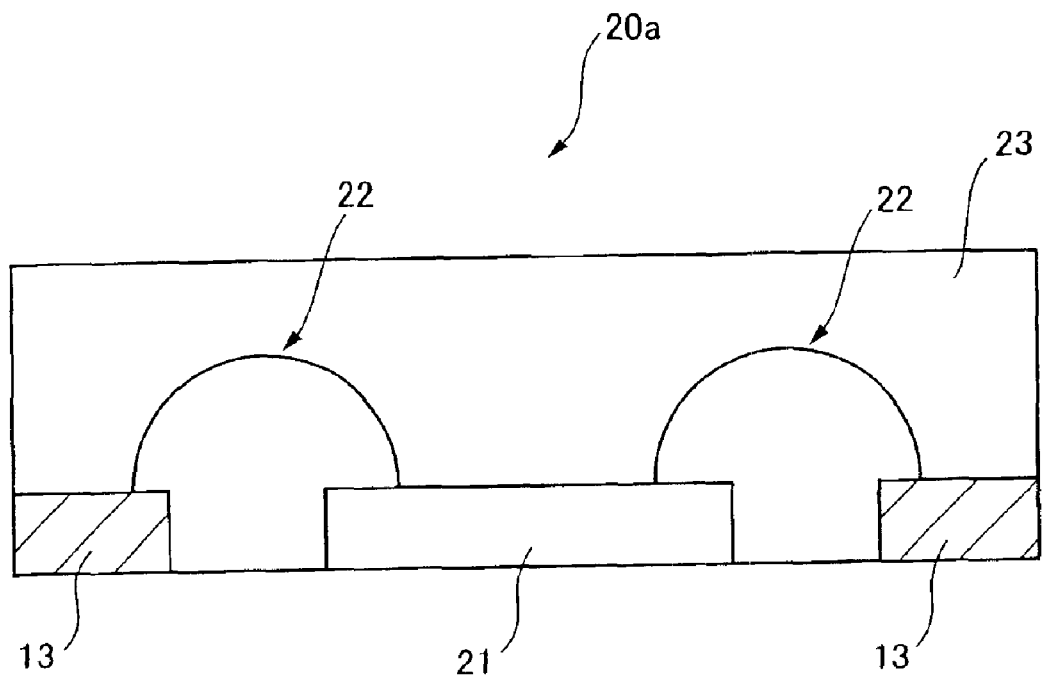
FIG. 8 is a cross-sectional view showing a constitution of a semiconductor device manufactured using a lead frame according to a fourth embodiment of the present invention.

FIG. 8 shows an example of a semiconductor device 20a with a QFN package structure manufactured using a lead frame (a lead frame without die-pad portions) according to a fourth embodiment of the present invention. Also, FIG. 9A to FIG. 9E collectively show a manufacturing process of the semiconductor device 20a.

The semiconductor device 20a shown in FIG. 8 is only different from the semiconductor device 20 shown in FIG. 6 in that the die-pad portions 12 are not provided therein. Other constitution is the same as the semiconductor device 20 shown in FIG. 6, and thus description thereof will be omitted. Also, a method of manufacturing the semiconductor device 20a shown in FIG. 9A to FIG. 9E is basically the same as the manufacturing steps for the semiconductor device 20 as shown in FIG. 7A to FIG. 7E, and thus description thereof will be also omitted.

Note, in the fourth embodiment, a base frame including opening portions and lead portions 13 around the respective opening portions 13 being defined for the respective semiconductor elements is used as the form of a base frame 11b (FIG. 9D and FIG. 9E) constituting a lead frame 10c. Accordingly, in the first step (FIG. 9A), the lead frame 10c is held with a holding jig (not shown) while allowing the surface attaching the adhesive tape 17 to be placed downward, and then semiconductor elements 21 will be mounted severally on the adhesive tape 17 inside the respective opening portions of the base frame 11b. The process to be performed in the steps shown in FIG. 9B and thereafter is identical to the process performed in the steps of FIG. 7B and thereafter.

What is claimed is:
1. A method of manufacturing a lead frame, comprising the steps of: forming a base frame which includes a region for resin-molding a plurality of semiconductor elements to be mounted on one surface of the base frame, the region being partitioned into land shapes, and in which a die-pad portion and lead portions around the die-pad portion are defined severally for the individual semiconductor elements to be mounted in each of the partitioned regions for resin-molding;

attaching an adhesive tape to another surface of the base frame; and providing the adhesive tape with a cut portion at a portion corresponding to a region between two adjacent partitioned regions for resin-molding.

2. The method according to claim 1, wherein in the step of providing the adhesive tape with a cut portion, the cut portion is partially provided so as to maintain an integrally connected state of the adhesive tape.

3. The method according to claim 2, wherein in the step of forming a base frame, a slit is formed in a region between two adjacent partitioned regions for resin-molding of the base frame, and wherein the cut portion is partially provided at a portion of the adhesive tape corresponding to a portion of the base frame where the slit is formed.

4. The method according to claim 1, wherein in the step of providing the adhesive tape with a cut portion, the cut portion is provided so as to separate the adhesive tape for the individual partitioned regions for resin-molding.

5. The method according to claim 1, between the step of forming a base frame and the step of attaching an adhesive tape, further comprising the step of forming a metal film on an entire surface of the base frame.

* * * * *